United States Patent
Tanaka et al.

(10) Patent No.: US 9,656,240 B2
(45) Date of Patent: May 23, 2017

(54) WATER-TRAPPING AGENT AND ORGANOELECTRONIC DEVICE COMPRISING THE SAME

(75) Inventors: Satoshi Tanaka, Mobara (JP); Shigeru Hieda, Mobara (JP); Yoshihisa Yonezawa, Mobara (JP); Youhei Fujimura, Mobara (JP)

(73) Assignee: Futaba Corporation, Chiba (JP)

( * ) Notice: Subject to any disclaimer, the term of this patent is extended or adjusted under 35 U.S.C. 154(b) by 873 days.

(21) Appl. No.: 13/206,213

(22) Filed: Aug. 9, 2011

(65) Prior Publication Data

US 2012/0037893 A1    Feb. 16, 2012

(30) Foreign Application Priority Data

Aug. 10, 2010  (JP) .................. 2010-179669
Aug. 10, 2010  (JP) .................. 2010-179670

(51) Int. Cl.
*B65D 85/00* (2006.01)
*H01L 51/00* (2006.01)
(Continued)

(52) U.S. Cl.
CPC ......... *B01J 20/2805* (2013.01); *B01J 20/041* (2013.01); *B01J 20/18* (2013.01);
(Continued)

(58) Field of Classification Search
CPC .... B01J 20/2805; B01J 20/223; B01J 20/041; B01J 20/18; H01L 51/448; H01L 51/5237;
(Continued)

(56) References Cited

U.S. PATENT DOCUMENTS 6,656,609 B2 * 12/2003 Takahashi et al. ........... 428/690
6,790,381 B2    9/2004 Tsuruoka et al.
(Continued)

FOREIGN PATENT DOCUMENTS

JP  2003264061 A  9/2003
JP  2010080289 A  4/2010

OTHER PUBLICATIONS

Okamoto, Y. (1983), Thermal aging study of carboxyl-terminated polybutadiene and poly(butadiene-acrylonitrile)-reactive liquid polymers. Polym Eng Sci, 23: 222-225.*
(Continued)

*Primary Examiner* — Lee E Sanderson
(74) *Attorney, Agent, or Firm* — Quarles & Brady LLP

(57) ABSTRACT

The present invention provides a water-trapping agent disposed inside a hermetically sealed container. The water-trapping agent comprises an organometallic compound as represented by Formula 1 as a drying agent component, and is obtained by a process comprising mixing the organometallic compound with organic solvent, and at least partially substituting the organic solvent with viscous replacement material:

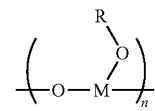

Formula I wherein R is selected from the group consisting of alkyl group, alkoxy group, alkenyl group, aryl group, cycloalkyl group, heterocyclic group and acyl group, M is a trivalent metal atom, and n is an integer of 1 or above.

4 Claims, 6 Drawing Sheets

(51) Int. Cl.
*B01J 20/28* (2006.01)
*B01J 20/04* (2006.01)
*B01J 20/18* (2006.01)
*B01J 20/22* (2006.01)
*H01L 51/44* (2006.01)
*H01L 51/52* (2006.01)
*H05B 33/04* (2006.01)

(52) U.S. Cl.
CPC .......... *B01J 20/223* (2013.01); *H01L 51/448* (2013.01); *H01L 51/5259* (2013.01); *H05B 33/04* (2013.01); *B01J 2220/66* (2013.01); *Y02E 10/549* (2013.01)

(58) Field of Classification Search
CPC ... H01L 51/5259; H01L 51/004; H05B 33/04; C08L 23/22; C09K 2200/04; C09K 2200/0239; C09K 2200/0617
USPC .......... 257/40; 428/35.7, 35.8, 35.9, 68, 76, 428/323, 500, 917; 206/525; 524/176; 313/504, 514
See application file for complete search history.

(56) References Cited

U.S. PATENT DOCUMENTS

2005/0227114 A1    10/2005   Tanaka et al.
2010/0001634 A1*    1/2010   Fujita et al. .................. 313/504
2014/0080978 A1*    3/2014   Ohi et al. .................. 525/332.1

OTHER PUBLICATIONS

Shin-Etsu Silicones Co. http://www.silicone.jp/e/products/usage/rein__modification/fluids.shtml and provided herewith.*
Sigma Aldrich Catalog, http://www.sigmaaldrich.com/catalog/product/aldrich/81324?lang=en&region=US.*
W&P Scientific, Inc. Viscosity Tables, archived online on Aug. 14, 204 at https://web.archive.org/web/20040814233355/http://www.vp-scientific.com/Viscosity_Tables.htm. p. 1.*
Patent Abstract of Japanese publication 2002-033187, published Jan. 31, 2002.

* cited by examiner

WATER-TRAPPING AGENT AND ORGANOELECTRONIC DEVICE COMPRISING THE SAME

CROSS REFERENCE TO RELATED APPLICATIONS

The present application claims the benefit of Japanese Patent Application 2010-179669, filed Aug. 10, 2010 and Japanese Patent Application 2010-179670, files Aug. 10, 2010, both of which are hereby incorporated by reference herein in their entirety for all purposes.

BACKGROUND OF THE INVENTION

The present invention relates to a water-trapping agent disposed inside a hermetically sealed container to capture or trap moisture generated in an electronic part for a long period of time, and an organoelectronic device in which the water-trapping agent is disposed.

In recent years, organic EL (electroluminescence) elements, organic light emitting system such as organic EL display and organic EL illumination, and organic electronic device such as organic semiconductor and organic solar battery have been widely studied and investigated, and are expected to be applied to a wide variety of basic elements and other use.

The organic EL element comprises an organic EL layer of a thin film containing a luminescent organic compound sandwiched between a pair of electrodes, a cathode and an anode. The organic EL element is a spontaneous light-emitting element in which a hole and an electron are injected into the thin film and recombined to generate an exiton and which utilizes emission of light (fluorescence/phosphorescence) when the exiton is inactivated.

The most significant problem of the above-described organic EL element is to improve its durability and, above all, generation of non-light emitting portion called "dark spot" and the prevention of its growth. When the diameter of the dark spot grows in tens of micrometers (μm), the non-light emitting portion can be confirmed by visual observation. A principal cause of the dark spot generation is the influence of water and oxygen, and particularly water, which has been known to influence the element most seriously even in a trace amount.

It is, therefore, necessary to prevent water from penetrating into the organic EL element, which is presently represented by a hollow sealing structure as disclosed in JP 2002-33187A. In accordance with the hollow sealing structure, the penetration of moisture or oxygen into the organic EL element can be controlled or prevented by sealing the organic EL element under dry inert gas atmosphere.

With reference to FIG. 8, the anode 35 of ITO film is formed on an element substrate 32 having insulating and translucent properties in the hollow sealing structure of organic EL element 31. An organic EL layer 34 is formed as a thin layer on the upper surface of the anode 35 by a PVD method such as molecular beam deposition method, resistive heating method, and the like. The organic EL layer 34 comprises three layers of a copper phthalocyanine (CuPc) layer 4a as a hole injection layer formed on the upper surface of the anode 35, a Bis((N-(1-naphtyl-n-phenyl))benzidine (α-NPD) layer 34b as a hole transport layer formed on the upper surface of the layer 4a, and a tris(8-quinolinolat) aluminum (Alq3) layer 34c as a light-emitting and electron transport layer formed on the upper surface of the layer 34b. The light-emitting part is formed by a laminate comprising the aforementioned anode 35, the organic EL layer 34, and a cathode 36 described later. The cathode 36 is formed as a metal thin film formed on the upper surface of the light-emitting and electron transport layer 34c. A part of the cathode 36 is pulled out to the end of the element substrate 32 and connected to a driving circuit (not shown). The drying film 37 is placed as a drying means on the substrate 32 and/or sealing cap 33 in the container which is hermetically sealed by the substrate 32, sealing cap 33 and adhesive 38.

However, in the above hollow sealing structure, due to insufficient sealing properties of drying means such as inorganic drying sheet should be disposed inside the container so as to chemically or physically adsorb moisture therein. In this case, the space for disposing the drying means should be made in the container, which accordingly increases the cost for manufacture. Moreover, nothing is in contact with the upper surface of the cathode, and heat can only be emitted via radiation and convection across a panel. For the reason as set forth above, heat cannot be sufficiently radiated away from, for example, organic EL for illumination. Further, due to the use of larger panel, deflection can be created in the center portion of the panel, thereby causing the panel to break when being in contact with other element(s) disposed therein.

In order to overcome the above drawbacks and problems, there has been suggested that the speed of moisture or oxygen penetration can be decreased by sealing the organic layer by means of the membrane of resin and/or glass. For more detail, see JP 2002-33187(A). In this constitution, heat emission and panel strength properties can be improved over the conventional technologies.

With reference to FIG. 9, the anode 45 of ITO film is formed on the upper surface of an element substrate 42 having insulating and translucent properties. An organic layer 44 is formed as a thin film on the upper surface of the anode 45 by a PVD method such as molecular beam deposition method, resistive heating method, and the like. The organic layer 44 comprises four layers of a copper phthalocyanine (CuPc) layer 44a as a hole injection layer formed on the upper surface of the anode 45, a Bis((N-(1-naphtyl-n-phenyl))benzidine (α-NPD) layer 44b as a hole transport layer formed on the upper surface of the hole injection layer 44a, a tris(8-quinolinolat)aluminum (Alq3) layer 44c as a light-emitting layer formed on the upper surface of the hole transport layer 44b, and a LiF layer 44d as an electron injection layer formed on the upper surface of the light-emitting layer 44c. A cathode 46 is formed as a metal thin film formed on the upper surface of the light-emitting layer 44d of the organic layer 44, and is protected from moisture penetration via a buffer layer 47 by a passivation layer 48 which is made of SiN, SiON, or $SiO_2$, and is formed thereon by physical vapor deposition method. A container is hermetically sealed by the element substrate 42, a sealing cap 43 and adhesive 49.

However, in a top emission-type solid sealing structure in which EL light generated from organic EL element is outwardly emitted from a sealing cap, it is hard to dispose drying agent, which does not have translucent properties, on a protective substrate from which light is emitted. In a case where drying agent is not employed, in order to guarantee sealing properties a passivation layer involving complicated process should be formed as a protective layer for the organic layer, thereby causing manufacturing cost and time to increase.

In view of the above, organic EL element disposed on the substrate may be sealed by a sealing cap, and water-trapping agent may be supplied into the inside of the above structure which is sealed by the substrate and the sealing cap so as to suppress or prevent dark spot generation. However, organic solvent is added to conventional translucent water-trapping agent so as to control the viscosity of the water-trapping agent, and it may be thus in direct contact with the organic layer when or after being supplied into the structure. Of course, the organic solvent itself is not necessary for water-trapping or drying performance of the water-trapping agent.

For the reasons set forth above, the organic solvent should be evaporated to dryness after supplying the water-trapping agent. However, the dried water-trapping agent is likely to be hardened, thereby making internal filling or charging difficult or impossible, and causing the organic layer to break due to the contact with the hardened water-trapping agent.

Also, this type of water-trapping agent has a tendency to crack when adsorbing moisture inside the element. As a result, the light to be emitted is subjected to irregular reflection or scattered reflection, thereby decreasing transmission. For the reason as set forth above, this type of water-trapping agent is not considered to be suitable for, particularly, the top emission-type structure.

Furthermore, in the hollow sealing structure, the organic layer disposed on the element substrate is sealed by the sealing cap, and the drying agent-containing water-trapping agent is applied onto the sealing cap. The organic solvent present in the water-trapping agent can be removed by heating. However, it is difficult to recover the organic solvent evaporated during the drying step. At the same time, it takes long time to complete the drying step.

In order to resolve the above drawbacks and problems, the present invention provides a novel water-trapping agent, and an organoelectronic device using the water-trapping agent therein.

SUMMARY OF THE INVENTION

In several aspects, the present invention provides the followings:

(1) A water-trapping agent disposed inside a hermetically sealed container, comprising an organometallic compound as represented by Formula 1 as a drying agent component, and being obtained by a process comprising mixing the organometallic compound with organic solvent, and substituting at least part of the organic solvent with a viscous replacement material:

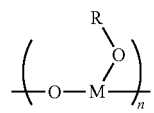

Formula I wherein R is selected from the group consisting of an alkyl group, an alkoxy group, an alkenyl group, an aryl group, a cycloalkyl group, a heterocyclic group and an acyl group; M is a trivalent metal atom; and n (representing the degree of polymerization) is an integer of more than one;

(2) A water-trapping agent disposed inside a hermetically sealed container, comprising an organometallic compound as illustrated by Formula 2 as a drying agent, and being obtained by a process comprising mixing the organometallic compound with organic solvent, and substituting at least part of the organic solvent with a viscous replacement material:

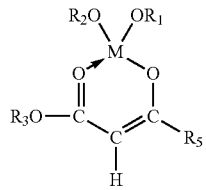

Formula 2 wherein each of R1, R2, R3, and R5 is independently selected from the group consisting of an alkyl group, an alkoxy group, an alkenyl group, an aryl group, a cycloalkyl group, a heterocyclic group and an acyl group having at least one carbon atom, and M is a trivalent metal atom.

(3) A water-trapping agent disposed inside a hermetically sealed container, comprising an organometallic compound as illustrated by Formula 3 as a drying agent, and being obtained by a process comprising mixing the organometallic compound with organic solvent, and substituting at least part of the organic solvent with a viscous replacement material:

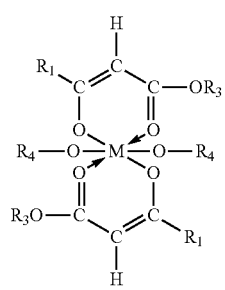

Formula 3 wherein each of R1, R3 and R4 is independently selected from the group consisting of an alkyl group, an alkoxy group, an alkenyl group, an aryl group, a cycloalkyl group, a heterocyclic group and an acyl group having at least one carbon atom, and M is a tetravalent metal atom;

(4) A water-trapping agent disposed inside a hermetically sealed container, comprising an organometallic compound as illustrated by Formula 1 as a drying agent, and being obtained by a process comprising mixing the organometallic compound with organic solvent, and substituting the organic solvent with a viscous replacement material:

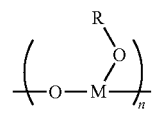

Formula I wherein R is at least one selected from the group consisting of an alkyl group, an alkoxy group, an alkenyl group, an aryl group, a cycloalkyl group, a heterocyclic group and an acyl group; M is a trivalent metal atom; and n is an integer of more than one;

(5) A water-trapping agent disposed inside a hermetically sealed container, comprising an organometallic compound as illustrated by Formula 2 as a drying agent, and being obtained by a process comprising mixing the organometallic compound with organic solvent, and substituting the organic solvent with a viscous replacement material:

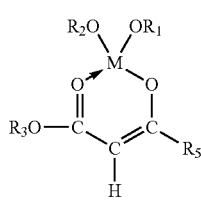

Formula 2 wherein each of R1, R2, R3, and R5 is independently selected from the group consisting of an alkyl group, an alkoxy group, an alkenyl group, an aryl group, a cycloalkyl group, a heterocyclic group and an acyl group having at least one carbon atom, and M is a trivalent metal atom;

(6) A water-trapping agent disposed inside a hermetically sealed container, comprising an organometallic compound as illustrated by Formula 3 as a drying agent, and being obtained by a process comprising mixing the organometallic compound with organic solvent, and substituting the organic solvent with a viscous replacement material:

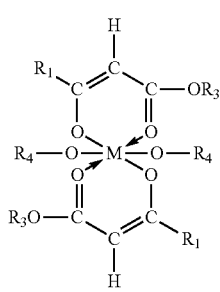

Formula 3 wherein each of R1, R3, and R4 is independently selected from the group consisting of an alkyl group, an alkoxy group, an alkenyl group, an aryl group, a cycloalkyl group, a heterocyclic group and an acyl group having at least one carbon atom, and M is a tetravalent metal atom;

The water-trapping agent described above may include a replacement material of a long-chain hydrocarbon polymer having an average molecular weight of 700 to 3,700, a content concentration of from 5 to 75%, and a viscosity of 600 Pa·S or below when heated to 60° C.;

(8) An organoelectronic device, comprising an insulating element substrate on which a laminate of a pair of electrodes and an organic layer sandwiched between the pair of electrodes is disposed; a sealing cap opposed to the element substrate, and disposed apart from the element substrate; and the water-trapping agent as described above, wherein the water-trapping agent is disposed inside a container which is hermetically sealed by the element substrate and the sealing cap; and (9) An organoelectronic device, comprising a container hermetically sealed by an insulating element substrate in which a laminate of a pair of electrodes and an organic layer sandwiched between the pair of electrodes is disposed, and a sealing cap, wherein an inner space of the container is filled with the water-trapping agent as described above.

In accordance with one aspect of the invention, for the organoelectronic device having a hollow sealing structure, drying process for the recovery of the organic solvent used can be largely shortened. Accordingly, cost and time for manufacture can be decreased.

Moreover, in accordance with another aspect of the invention, the organic layer of the organoelectronic device having solid sealing structure is not affected by the presence of the water-trapping agent that is supplied into and is disposed inside the device. Also, the water-trapping agent can be easily supplied to inside the device due to the viscosity of the replacement material used. The water-trapping agent can also be used as damping material absorbing shock from outside, thereby preventing physical disruption of the organic layer. Further, the water-trapping agent is not liable to crack, and is thus not liable to lack transparency or to be colored due to crack generation, thereby causing it to be well suited for the top emission-type structure in which light is emitted from the opposite side of the element substrate.

BRIEF DESCRIPTION OF THE DRAWINGS

The invention may be put into practice in various ways and a number of embodiments will be described by way of example to illustrate the invention with reference to the accompanying drawings, in which.

DETAILED DESCRIPTION OF THE INVENTION

A water-trapping agent in accordance with an embodiment of the invention can be employed in a wide variety of organoelectronic devices, including but not limited to, an organic EL display such as an organic EL element, an organic EL illumination, an organic semiconductor, or an organic solar battery, having a hollow sealing structure in which a laminate of a pair of electrodes and an organic layer sandwiched between the pair of electrodes is hermetically sealed by an insulating element substrate and a sealing cap. The sealing cap is opposed to the element substrate, and is disposed apart from the element substrate. As such, moisture is efficiently adsorbed, and thus dark spot generation can be remarkably suppressed.

The invention will be further explained hereinafter with reference to an example in which a water-trapping agent in accordance with an embodiment of the invention is employed in organic EL element.

Figure 1:
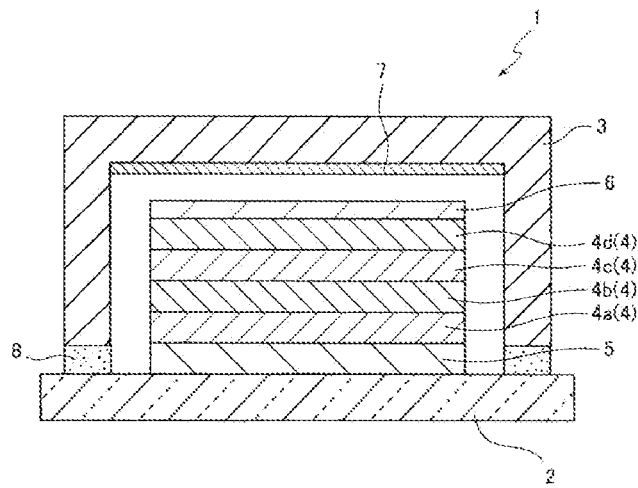
FIG. 1 is a cross-sectional view of an organic EL element having a hollow sealing structure in accordance with an embodiment of the invention.

As shown in FIG. 1, an organic EL element 1 of hollow sealing structure comprises as a base an element substrate 2 formed of a rectangle-shaped insulating and translucent glass substrate. With reference to FIG. 1, the anode 5 of indium tin oxide (i.e., ITO) layer is formed as a transparent conductive material on the upper surface of the element substrate 2. The ITO layer is formed on the upper surface of the element substrate 2 by, for example, PVD (Physical Vapor Deposition method) such as a vacuum deposition method, sputtering method, and the like. Thereafter, a given pattern is applied on the layer by etching by means of photoresist method so as to form the anode 5. A part of the anode 5 is pulled out to the end of the element substrate 2 and connected to a driving circuit (not shown).

The organic EL layer 4 is formed on the upper surface of the anode 5 by PVD method such as molecular beam deposition method, resistive heating method, and the like. With reference to FIG. 1, the organic layer 4 is shown to include four layers of a copper phthalocyanine (CuPc) layer 4a as a hole injection layer formed on the upper surface of the anode 5 in the thickness of about tens of nanometers, a Bis((N-(1-naphtyl-n-phenyl))benzidine (α-NPD) layer 4b as a hole transport layer formed on the upper surface of the hole injection layer 4a in the thickness of about tens of nanometers, a tris (8-quinolinolat)aluminum (Alq3) layer 4c as a light-emitting layer formed on the upper surface of the hole transport layer 4b in the thickness of about tens of nanometers, and a lithium fluoride (LiF) layer 4d as an electron transport layer formed on the upper surface of the light-emitting layer 4c in the thickness of several nanometers. A light-emitting part is defined by a laminate comprising the aforementioned anode 5, the organic layer 4, and the cathode 6 which will be described thereafter.

As shown in FIG. 1, the cathode 6 is formed as a thin metal layer which is formed on the upper surface of the organic layer 4 (i.e., the electron transport layer 4d). The material for the thin metal layer includes a simple metal material of small working function such as Al, Li, Mg, In, and the like, and an alloy of small working function such as Al—Li alloy, Mg—Ag alloy, and the like. The cathode 6 is formed in the thickness of, for example from several tens nanometers to several thousand nanometers, preferably from 50 nm to 200 nm. A part of the cathode 6 is pulled out to the end of the element substrate 2, and connected to a driving circuit (not shown).

On the other hand, a sealing cap 3 which is opposed to the element substrate 2 and is made by processing a rectangle-shaped sheet glass is provided. A rectangle-shaped sealing cap 3 is fixed as a sealing member to the outer periphery of the element substrate 2 by means of sealing agent 8 formed of ultraviolet-curable resin under an inert gas atmosphere from which the moisture has been almost or completely removed (for example, dry nitrogen) or under a dry atmosphere of dry air, thereby allowing protection of the anode 5, the organic layer 4 and cathode 6.

In addition, a depression is formed via process work in the inner face of the sealing cap 3, facing the organic layer 4. The water-trapping agent 7 which includes as a drying agent component the organometallic compound as represented by the Formula 1, and is obtained by substituting at least part of the organic solvent mixed with the organometallic compound with the viscous replacement material is placed as drying means inside the depression of the sealing cap 3.

Figure 2:
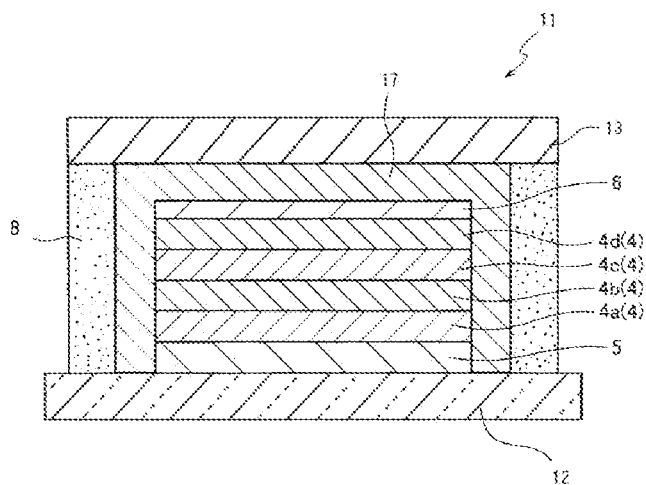
FIG. 2 is a cross-sectional view of an organic EL element having a solid sealing structure in accordance with an embodiment of the invention.

FIG. 2 shows an organic EL element having a solid sealing structure in accordance with an embodiment of the invention. The same numeral(s) as FIG. 1 basically represents the same part(s), component(s), or element(s) in FIG. 2. With reference to FIG. 2, a rectangle-shaped sealing cap 13 is fixed as a sealing member to the outer periphery of an element substrate 12 by means of, for example, sealing agent 8 formed of ultraviolet-curable resin under an inert gas atmosphere which moisture has been almost or completely removed (for example, dry nitrogen) or under a dry atmosphere of dry air. As such, the anode 5, the organic layer 4 and cathode 6 can be effectively protected.

A water-trapping agent 17 which includes as a drying agent component, the organometallic compound as represented by the Formula 1, and is obtained by substituting organic solvent mixed with the organometallic compound with viscous replacement material is placed as drying means inside the container which is hermetically sealed by the element substrate 12, the sealing cap 13, and the sealing agent 8. In other words, the hermetically sealed container (particularly, vacant space inside the container) is filled with the water-trapping agent 17.

The drying agent and replacement material which constitute the water trapping agents 7 and 17 that are respectively to be supplied into the organic EL elements 1 and 11 will be described hereinafter.

Drying Agent.

In the water trapping agents 7 and 17, the component of the drying agent is formed of the organometallic compound illustrated by the Formula 1 in which R is selected from the group consisting of alkyl group, alkoxy group, alkenyl group, aryl group, cycloalkyl group, heterocyclic group and acyl group having at least one carbon atom, M is a trivalent metal atom, and n representing degree of polymerization is an integer of 1 or above.

In a case where n is 3 in the above organometallic compound illustrated by the Formula 1, ring structure as illustrated by the following Formula 4 in which each of R1, R2, and R3 is independently selected from the group consisting of alkyl group, alkoxy group, alkenyl group, aryl group, a cycloalkyl group, a heterocyclic group and an acyl group having at least one carbon atom, and M is a trivalent metal atom. When the organometallic compound illustrated by the Formula 1 has ring structure, reaction equation with water is provided as the following Formula 5. As shown in the Formula 5, addition reaction with water molecule is carried out so as to capture or trap water or moisture inside the container.

Formula 4

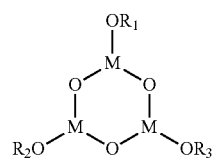

Formula 5

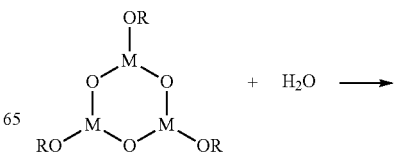

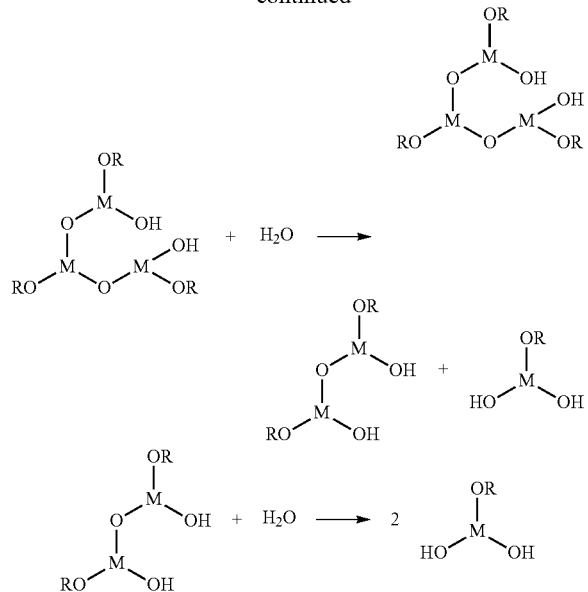

For the reason as set forth above, it is considered that the organometallic compound can chemically remove water.

Examples of substituent are described below but not limited thereto. R can be selected independently from each other.

R is one independently selected from the group consisting of an alkyl group, alkoxy group, alkenyl group, aryl group, cycloalkyl group, heterocyclic group and acyl group having at least one carbon atom. The Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having eight or more carbon atoms. Examples of substituted or non-substituted alkyl group are preferably those described below and an oligomer or polymer thereof may be used.

An Alkenyl group may be a vinyl group, allyl group, butenyl group, pentenyl group, hexenyl group and the like, and examples of substituted or non-substituted alkenyl group having eight or more carbon atoms may be preferably those described below. The oligomer or polymer thereof may be also used.

An Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group, and the like and may be preferably those having eight or more carbon atoms. The oligomer or polymer thereof may be used.

Examples of substituted or non-substituted alkoxy group may be a methoxy group, n-butoxy group, tert-butoxy group, trichloromethoxy group, trifluoromethoxy group, and the like and may be preferably those having eight or more carbon atoms. The oligomer or polymer thereof may be used.

Examples of substituted or non-substituted cycloalkyl group may be a cyclopentyl group, cyclohexyl group, nor-bornane group, adamantane group, 4-methylcyclohexyl group, 4-cyanocyclohexyl group and the like and may be preferably those having eight or more carbon atoms. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group and the like. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group, and the like. These acyl groups may be substituted with fluorine, chlorine, bromine, iodine and the like. The number of carbon atoms of the acyl group may be preferably eight or above. The oligomer or polymer thereof may be used.

Examples of the organometallic compound in which R is substituted with one of the above-described substituents, and trivalent metal is aluminum are those illustrated by Formulae 6 to 13 below.

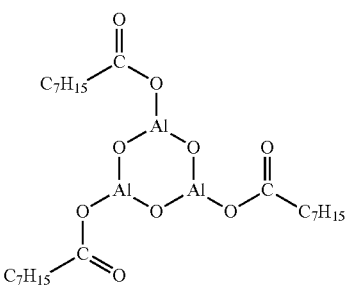

Formula 6

Formula 7

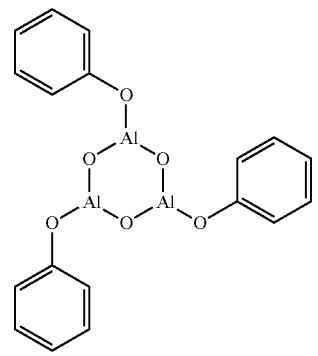

Formula 8

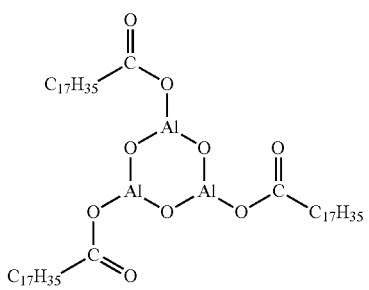

Formula 9

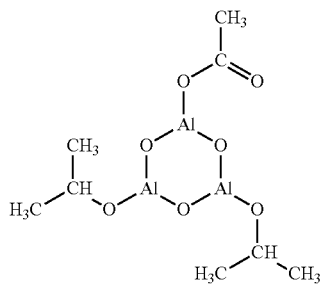

Formula 10

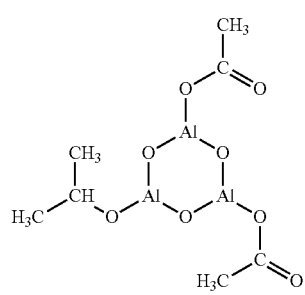

Formula 11

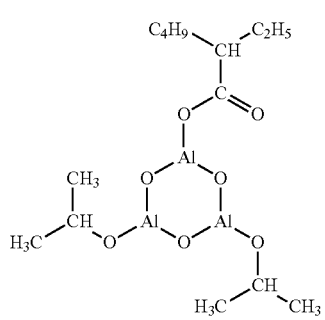

Formula 12

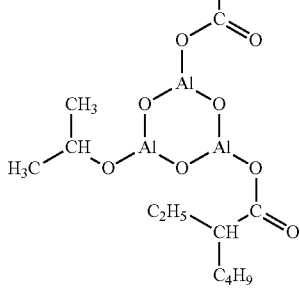

Formula 13

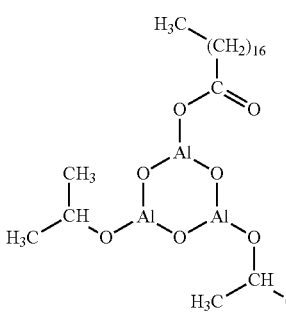

The inventors have found that the organometallic compound as illustrated by Formula 2 is subjected to substitution reaction with water molecule to capture or trap moisture, as represented by Formula 14 below. As such, the inventors have estimated that the organometallic compound as illustrated by Formula 2 can be used as a drying agent for an organic EL element, and have verified that the organometallic compound as illustrated by Formula 2 is effective as drying means through the experiments.

Formula 14

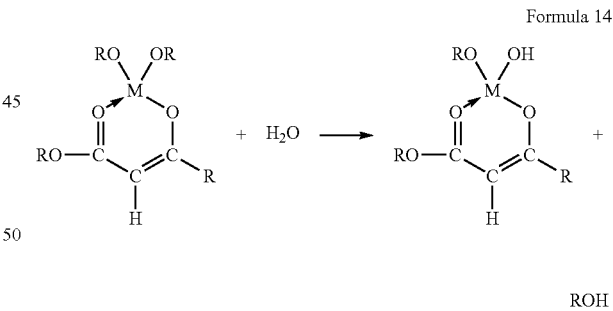

Examples of substituent are described below but not limited thereto. Each of R1, R2, R3, and R5 represents alkyl group, alkoxy group, alkenyl group, aryl group, cycloalkyl group, heterocyclic group, or acyl group which has at least one carbon atom. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having eight or more carbon atoms. Examples of substituted or non-substituted alkyl group are preferably those described below and an oligomer or polymer thereof may be used.

Alkenyl group may be a vinyl group, allyl group, butenyl group, pentenyl group, hexenyl group, and the like, and examples of substituted or non-substituted alkenyl group having eight or more carbon may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group and the like. The oligomer or polymer thereof may be used.

Examples of substituted or non-substituted alkoxy group may be a methoxy group, n-butoxy group, tert-butoxy group, trichloromethoxy group, trifluoromethoxy group and the like. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group and the like. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, is ophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group and the like. These acyl groups may be substituted with fluorine, chlorine, bromine, iodine and the like. The oligomer or polymer thereof may be used.

Examples of the organometallic compound in which R1, R2, R3, and R5 are independently substituted with one of the above-described substituents, and trivalent metal is aluminum are organometallic compound or organometallic complex compound illustrated by Formulae 15 to 18 below.

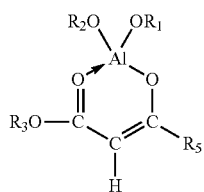

Formula 15

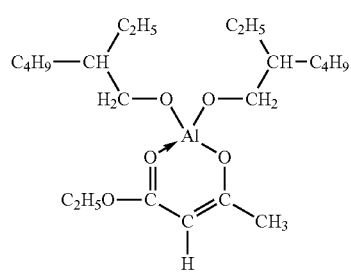

Formula 16

Aluminium-di-2-ethylhexyloxide-mono-Ehtyl aceto acetate Chelope-EH-2

-continued

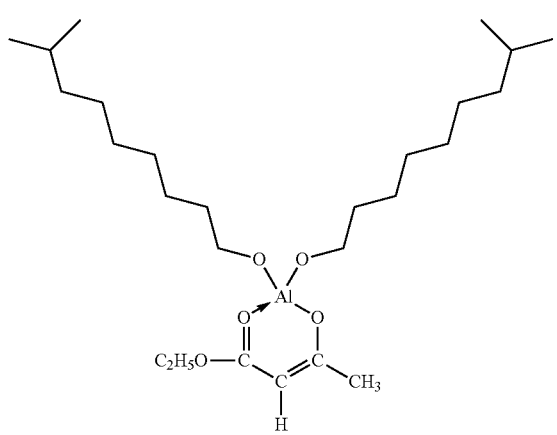

Aluminium-di-2-methylnonyloxide-mono-Ehtyl aceto acetate Chelope C10-2

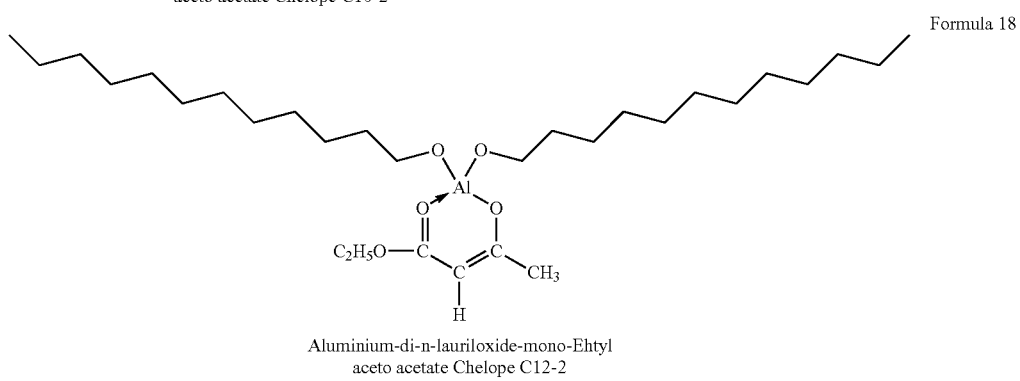

Formula 18

Aluminium-di-n-lauriloxide-mono-Ehtyl aceto acetate Chelope C12-2

An example of the organometallic compound in which the trivalent metal is lanthanum is the organometallic complex compound illustrated by Formula 19 below.

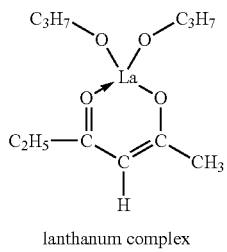

Formula 19 lanthanum complex

An example of the organometallic compound in which the trivalent metal is yttrium is the organometallic complex compound illustrated by Formula 20 below.

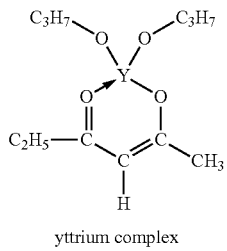

Formula 20 yttrium complex

An example of the organometallic compound in which the trivalent metal is gallium is the organometallic complex compound illustrated by Formula 21 below.

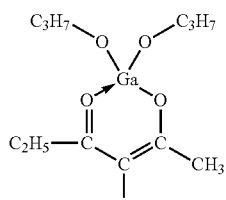

Formula 21 gallium complex

The inventors have found that the organometallic compound as illustrated by Formula 3 is subjected to substitution reaction with water molecule to capture or trap moisture, as represented by Formula 14 above. As such, the inventors have estimated that the organometallic compound as illustrated by Formula 3 can be used as drying agent for an organic EL element, and have verified that the organometallic compound as illustrated by Formula 3 is effective as drying means through the experiments. Examples of substituent are described below but not limited thereto.

Each of R1, R3 and R4 is independently selected from the group consisting of alkyl group, alkoxy group, alkenyl group, aryl group, cycloalkyl group, heterocyclic group, or acyl group having at least one carbon atom. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having eight or more carbon atoms. Examples of substituted or non-substituted alkyl group are preferably those described below and an oligomer or polymer thereof may be used.

Alkenyl group may be a vinyl group, allyl group, butenyl group, pentenyl group, hexenyl group, and the like, and examples of substituted or non-substituted alkenyl group having eight or more carbon atoms may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group and the like. The oligomer or polymer thereof may be used.

Examples of substituted or non-substituted alkoxy group may be a methoxy group, n-butoxy group, tert-butoxy group, trichloromethoxy group, trifluoromethoxy group and the like. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group, and the like. These acyl groups may be substituted with fluorine, chlorine, bromine, iodine and the like. The oligomer or polymer thereof may be used.

An example of the organometallic compound in which R is substituted with one of the above-described substituents, and tetravalent metal is germanium is the organometallic complex compound illustrated by Formula 22 below.

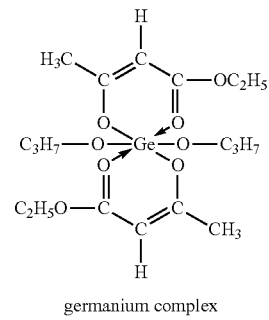

Formula 22 germanium complex

An example of the organometallic compound in which R is substituted with the above-described substituents, and tetravalent metal is silicon is the organometallic complex compound illustrated by Formula 23 below.

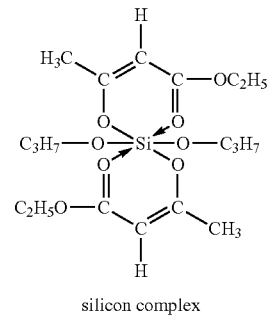

Formula 23 silicon complex

Moreover, because the compound material as illustrated by the Formula 1, 2, or 3 is dissolved in aromatic organic solvent such as toluene and xylene and aliphatic organic solvent such as n-decane, a general drying agent including a chemical adsorption-based drying agent such as zeolites, calcium oxide, strontium oxide, barium oxide can be also dispersed in the above organic solvent.

Replacement Material.

A replacement material that can be used for solvent replacement has proper viscosity thereby enabling the water-trapping agent to be disposed in a hermetically sealed container, and is compatible with the drying agent used. The replacement material can be arbitrarily selected from the group consisting of long-chain hydrocarbon polymer, silicone oil, and liquefied synthetic rubber.

In the hollow sealing structure, the amount of the replacement material needed for solvent replacement for at least part of the organic solvent that has been added to the drying agent used can be appropriately determined such that a period of time for drying process can be shortened in comparison with conventional water-trapping agent. Accordingly, the amount of the replacement material to be used can be appropriately controlled depending upon the amount of the organic solvent added to the drying agent used. Moreover, the replacement material does not have tendency to lack transparency or to be colored due to crack generation when being used as part of the water-trapping agent in the top emission-type structure in which light is emitted from the sealing cap side. Also, the replacement material will not affect the organic layer, even if it is used for solvent replacement for the organic solvent in the solid sealing structure.

Long-Chain Hydrocarbon Polymer.

A Long-chain hydrocarbon polymer as used herein has an average molecular weight of from 300 to 3,700, a content concentration of from 5 to 75%, and a viscosity of 600 Pa·S or below when heated to 60° C., and can be illustrated by Formula 24 below.

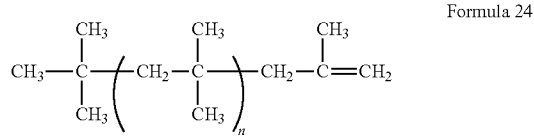

Formula 24

Figure 3:
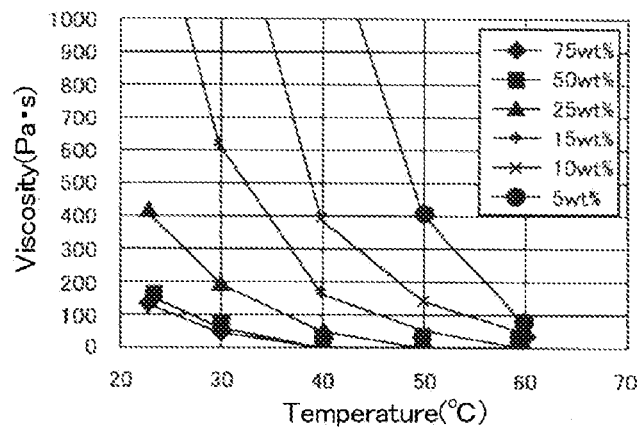
FIG. 3 is a graph showing the relationship between temperature and viscosity in a water-trapping agent in accordance with an embodiment of the invention.

The amount of long-chain hydrocarbon polymer to be added can be appropriately controlled depending upon the amount of the organic solvent added to the organometallic compound, and/or the method of feeding or supplying the water-trapping agent, including a dispenser method, a screen printing method, a spraying method, a hot-melt method, and so on. Generally, the long-chain hydrocarbon polymer can be added in an amount of from about 5 wt % to about 95 wt %. In the case of dispenser method, the long-chain hydrocarbon polymer is preferably added in an amount of from about 25 wt % to about 75 wt %. In other words, the application process can be further facilitated when the viscosity of material to be applied onto an object is 600 Pa·S or below. In a case where the long-chain hydrocarbon polymer has an average molecular weight of 1,400 or below, the amount of the long-chain hydrocarbon polymer to be added is preferably from 5 wt % to 75 wt %. FIG. 3 is a graph showing the relationship between temperature and viscosity for each long-chain hydrocarbon polymer having an average molecular weight of 1,400 and added in different amount. FIG. 3 shows that the viscosity of 600 Pa·S or below at a temperature of 60° C. can be easily achieved when the long-chain hydrocarbon polymer having an average molecular weight of 1,400 is added in an amount of from 5 wt % to 75 wt %. Furthermore, in order to improve or enhance the flexibility or pliability of the water-trapping agent to be applied to the sealing cap 3 to facilitate application process, application can be performed at an elevated temperature of from 30° C. to 60° C.

Silicone Oil.

Silicone oil used herein may be carboxyl-modified silicone oil in which organic groups are introduced into both terminal ends of the silicone oil, and can be represented by Formula 25 below.

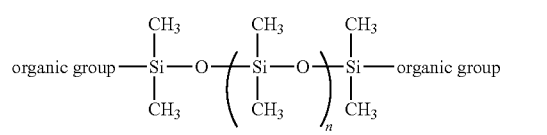

Formula 25

Silicone oil used herein may be carboxyl-modified silicone oil in which an organic group(s) is introduced into side chain of the silicone oil, and can be represented by Formula 26 below.

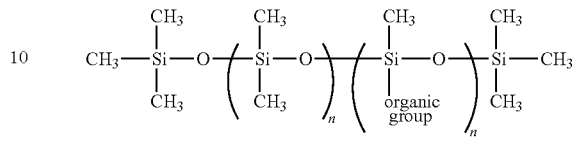

Formula 26

The amount of silicone oil to be added can be appropriately controlled depending upon the amount of the organic solvent added to the organometallic compound, and/or the method of filling the water-trapping agent including a dispenser method, a screen printing method, a spraying method, a hot-melt method, and so on. For example, in the case of dispenser method, the silicone oil is preferably added in an amount of from 10 wt % to 25 wt %.

Liquefied Synthetic Rubber.

The liquefied synthetic rubber as used herein includes carboxyl-terminal moiety-containing butadiene having an average molecular weight of 4,200, and can be represented by Formula 27 below.

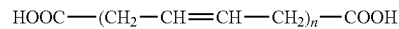

$HOOC-(CH_2-CH=CH-CH_2)_n-COOH$

Formula 27

The amount of the liquefied synthetic rubber to be added can be appropriately controlled depending upon the amount of the organic solvent added to the organometallic compound, and/or the method of filling the water-trapping agent including a dispenser method, a screen printing method, a spraying method, a hot-melt method, and so on. For example, in the case of dispenser method, the liquefied synthetic rubber is preferably added in an amount of from 10 wt % to 25 wt %.

EXAMPLES

There will be provided descriptive explanation regarding a method for preparing an embodiment of the water-trapping agent 7 in accordance with the invention, and a method for preparing an embodiment of the organic EL element by using the water-trapping agent 7. However, it is intended that the invention not be limited to the particular embodiment disclosed in the detailed description of the invention, but that the invention will include all embodiments falling within the scope of the appended claims.

Example 1

Method of Preparing Water-Trapping Agent

Aluminum oxide octylate, one of the organometallic compound as illustrated by Formula 5 above was mixed with n-decane having a boiling point of 170° C. in an amount of 10 wt % so as to obtain a drying agent having a concentration of n-decane in 10%.

Subsequently, 150 g of the drying agent thus obtained was displaced in a flask, as a replacement material, 15 g of polybutene (HV15) having an average molecular weight of 630 which was obtained from Nippon Oil Ltd. was added to the drying agent to obtain a mixture. The mixture was heated under vacuum by an evaporator. Due to vacuum heating n-decane included in the drying agent was evaporated, and n-decane was replaced with the replacement material, polybutene resulting in water-trapping agent 7.

Method for Manufacturing an Organic EL Element.

Figure 4:
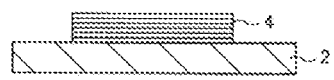
FIG. 4 is a cross-sectional view showing a process for preparing an organic EL element of a hollow sealing structure in accordance with an embodiment of the invention.
Figure 4:
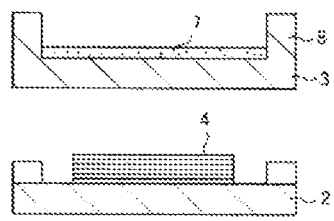
Figure 4:
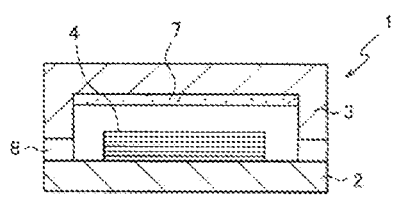

As shown in FIG. 4(*a*), the anode of ITO film of 140 nm in thickness was formed as a transparent conductive material on an element substrate 2 by sputtering method. Thereafter, patterning was carried out in a given pattern by etching by means of photoresist method to form the anode 5. A part of the anode 5 as an electrode is pulled out to the end of the element substrate 2 and connected to a driving circuit (not shown). On the upper surface of the anode 5 were formed the copper phthalocyanine (CuPc) layer 4*a* as a hole injection layer was formed in film thickness of 70 nm by means of resistive heating method. Bis((N-(1-naphthyl-n-phenyl)) benzidine (α-NPD) layer 4*b* as a hole transport layer was formed on the upper surface of the layer 4*a* in film thickness of 30 nm. Tris (8-quinolinolat) aluminum (Alq3) layer 4*c* as a light-emitting layer was formed on the upper surface of the layer 4*b* in film thickness of 50 nm. Subsequently, on the upper surface of the organic layer 4*c* a layer of lithium fluoride (LiF) of 7 nm in thickness was formed as an electron transport layer 4*d*. Al of 150 nm in thickness was formed as a cathode 6 by a physical deposition method. A part of the cathode 6 is pulled out to the end of the element substrate 2 and connected to a driving circuit (not shown).

Subsequently, in a nitrogen (dew point of −74° C. or below)—substituted glove box, a depression was formed in an element substrate 3, as shown in FIG. 4(*b*). The water-trapping agent 7 was applied onto the bottom of the depression by means of a dispenser such that the thickness of the water-trapping agent 7 applied was the same as or less than the height or depth of the depression. Sealing agent 8 containing ultraviolet curable resin was applied onto contact region between a sealing cap 3 and the element substrate 2 by use of a dispenser.

Then, as shown in FIG. 4(*c*), the sealing cap 3 was coupled to the organic layer 4-laminated element substrate 2 via the sealing agent 8 by ultraviolet radiation and heating at 80° C. resulting in an organic EL element 1.

Figure 5:
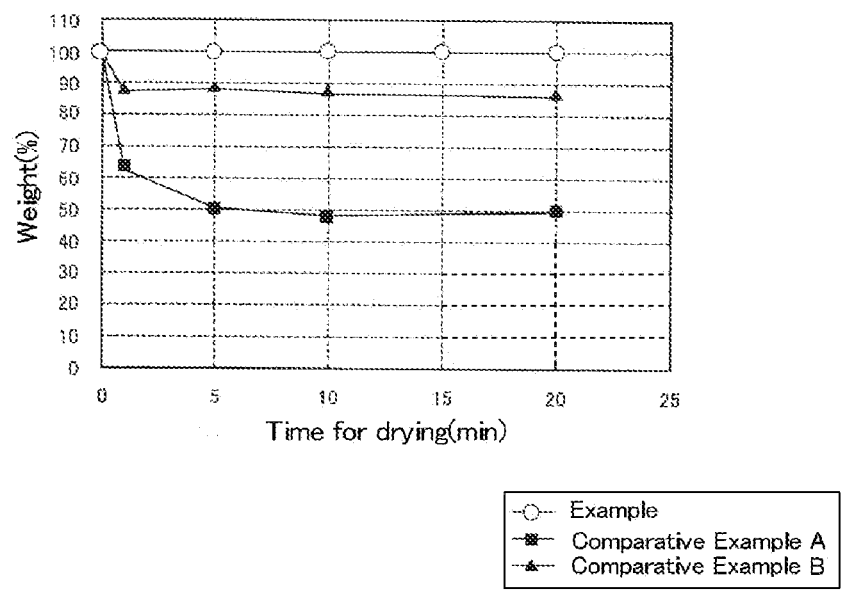
FIG. 5 is a graph showing variation in dry weight of each water-trapping agent over time when a water-trapping agent in accordance with an embodiment of the invention and conventional water-trapping agents are dried by a hot plate.

FIG. 5 is a graph showing dry weight variation over time when the water-trapping agent was dried by means of a hot plate. For comparison, there were provided water-trapping agent A, and water-trapping agent B. The water-trapping agent A (Comparative example) was prepared by adding organic solvent (i.e., petroleum-based hydrocarbon) to aluminum oxide octylate, and mixing the organic solvent and the aluminum oxide octylate such that the content of the organic solvent is 52 wt % on the basis of total weight, and the viscosity of the water-trapping agent was 0.03 Pa·s. The water-trapping agent B (Comparative example) was prepared by heating the water-trapping agent A under vacuum such that the water-trapping agent is applicable by means of a dispenser and etc. in terms of viscosity. The water-trapping agent B had the organic solvent content of 13 wt %, and the viscosity of 400 Pa·s.

As shown in FIG. 5, the water-trapping agent A and water-trapping agent B generally reached their dry weights in about 5 minutes and about 1 minute respectively when being heated at 150° C. under ordinary pressure. To the contrary, the organic solvent was replaced with the replacement material in the water-trapping agent 7 thereby shortening the period of time to dry the water-trapping agent, in comparison with the conventional water-trapping agents A and B. In other words, due to the solvent substitution the dry weight of the water-trapping agent 7 was obtained without drying operation. Moreover, the period of time to dry water-trapping agent in the process of preparing the EL element may practically get longer for the reason of elevated or lowered temperature.

Example 2

Method for Manufacturing Organic EL Element

Figure 6:
FIG. 6 is a cross-sectional view showing a process for preparing an organic EL element of a solid sealing structure in accordance with an embodiment of the invention.
Figure 6:
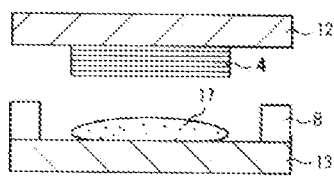
Figure 6:
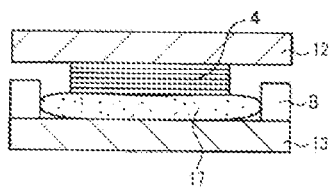
Figure 6:
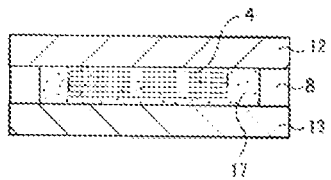

With reference to FIG. 6, a method for manufacturing organic EL element will be described in detail. Example 2 is substantially equal to Example 1 except that the hollow sealing structure was substituted with a solid sealing structure. Accordingly, the same numeral basically represents the same part or component through the drawings attached thereto.

A method for manufacturing an element substrate 12 as shown in FIG. 6(*a*) is equal to that of Example 1. For more detail, see FIG. 4(*a*). Subsequently, in a nitrogen (dew point of −74° C. or below)—substituted glove box, the water-trapping agent 7 was applied onto a sealing cap 13 in a predetermined amount by means of a dispenser. See FIG. 6(*b*). Then, ultraviolet curable resin-containing sealing agent 8 was applied by a dispenser so that the water-trapping agent 7 was substantially surrounded by the sealing agent 8.

As shown in FIG. 6(*c*), the sealing cap 13 was then coupled to the organic layer 4-laminated element substrate 12 via the sealing agent 8 by ultraviolet radiation and heating at 80° C. As a result, an organic EL element 11 having a solid sealing structure was obtained. As shown in FIG. 6(*d*), the water-trapping agent 7 was filled in a tight container.

Figure 7:
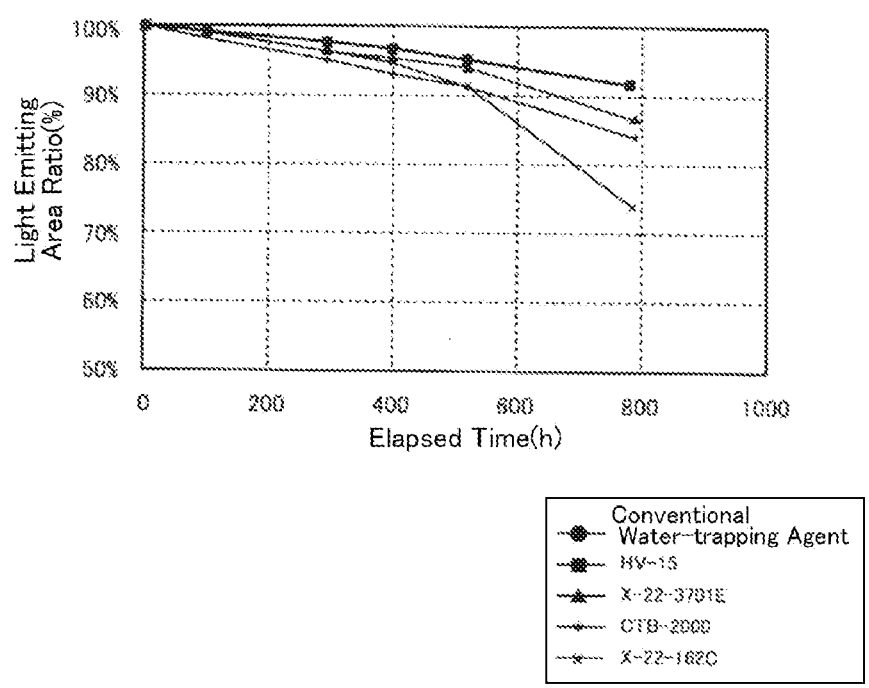
FIG. 7 is a graph showing variation in light emitting area ratio (%) of an organic EL element over time elapsed, wherein the organic EL element included water-trapping agent in accordance with an embodiment of the invention therein.
Figure 8:
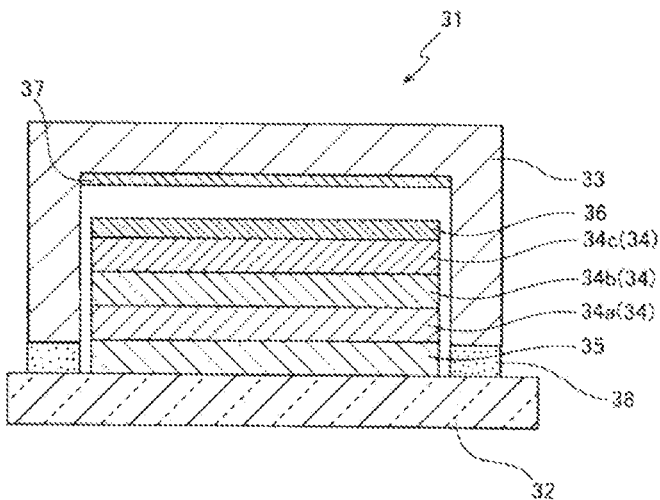
FIG. 8 is a cross-sectional view of an organic EL element having conventional hollow sealing structure.
Figure 9:
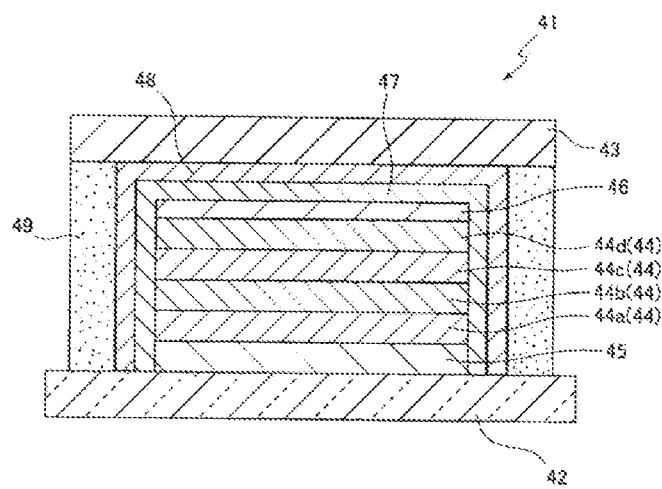
FIG. 9 is a cross-sectional view of organic EL element having conventional solid sealing structure.

FIG. 7 is a graph showing variation in light emitting area ratio (%) of an organic EL element over time elapsed, wherein the organic EL element employed the water-trapping agent in accordance with an embodiment of the invention. For more detail, in the light emitting area of the organic El element 11, the growth of dark spot was observed by microscope after a period of 300 hours under high temperature and humidity storage test condition. For comparison, there were provided a conventional water-trapping agent. The conventional water-trapping agent was prepared by adding organic solvent (i.e., petroleum-based hydrocarbon) to aluminum oxide octylate obtained from hope chemical Co. Ltd. under the trade name of "OLEEP", mixing the organic solvent and the aluminum oxide octylate such that the content of the organic solvent is 52 wt % on the basis of total weight, and heating the mixture under vacuum such that it is applicable by means of a dispenser and etc. in terms of viscosity. The conventional water-trapping agent thus obtained had the organic solvent content of 13 wt %, and the viscosity of 300-500 Pa·s (25° C.). The conventional water-trapping agent as prepared above was employed for organic EL element having hollow sealing structure, which will be also called as "comparative example" hereafter.

As shown in FIG. 7, when each organic EL element was lighted after the elapse of 300 hours, the light emitting area ratio (%) of Example 2 was substantially equal to that of comparative example in which the conventional water-trapping agent was dried for 10 minutes at the temperature of 150° C. Moreover, when each organic EL element was lighted after the elapse of 780 hours, the light emitting area ratio (%) of Example 2 was substantially equal to that of the comparative example. The above results have demonstrated that Example 2 can be a high-performance product. When the conventional water-trapping agent that was not subject to drying operation was employed for organic EL element, a number of dark spots were generated. This is because the organic layer 4 was affected by the organic solvent which had been evaporated from the water-trapping agent used. To the contrary, in the case of Example 2 in which the water-trapping agent 7 was employed, the organic layer 4 was not affected at all. This is because the organic solvent was substituted with viscous replacement material.

Example 3

Method for Manufacturing Organic EL Element with Modified Silicone Oil

Example 3 was substantially equal to Example 2 except that modified silicone oil obtained from Shin-Etsu Chemical Co., Ltd. under the trade name of X-22-3701E was used as the replacement material. In the light emitting area of the organic El element 11, the growth of dark spot was observed by microscope after a period of 200 hours under high temperature and humidity storage test condition (temperature: 85° C.; humidity: 85%). For comparison, organic EL element having hollow sealing structure in which the conventional water-trapping agent as described in Example 2 (organic solvent content: 13 wt %) was employed as comparative example.

As shown in FIG. 7, when each organic El element was lighted after the elapse of 300 hours, the light emitting area ratio (%) of Example 3 was almost equal to that of the comparative example in which the conventional water-trapping agent was dried for 10 minutes at the temperature of 150° C. Moreover, when each organic EL element was lighted after the elapse of 780 hours, the light emitting area ratio (%) of Example 3 was substantially equal to that of the comparative example. The above results have demonstrated that Example 3 can be a high-performance product. When the conventional water-trapping agent that was not subject to drying operation was employed for organic EL element, a number of dark spots were generated. This is because the organic layer 4 was affected by the organic solvent which had been evaporated from the water-trapping agent used. To the contrary, in the case of Example 3 in which the water-trapping agent 7 was employed, the organic layer 4 was not affected at all. This is because the organic solvent was substituted with viscous replacement material.

Example 4

Method for Manufacturing Organic EL Element with Butadiene Rubber

Example 4 was substantially equal to Example 2 except that carboxyl terminus-containing butadiene rubber obtained from Ube Industries, Ltd. under the trade name of HYCAR CTB 2000 was used as the replacement material. In the light emitting area of the organic El element 11, the growth of dark spot was observed by microscope after a period of 200 hours under high temperature and humidity storage test condition (temperature: 85° C.; humidity: 85%). For comparison, organic EL element having hollow sealing structure in which the conventional water-trapping agent as described in Example 2 (organic solvent content: 13 wt %) was employed as comparative example.

As shown in FIG. 7, when each organic El element was lighted after the elapse of 300 hours, the light emitting area ratio (%) of Example 4 was almost equal to that of the comparative example in which the conventional water-trapping agent was dried for 10 minutes at the temperature of 150° C. Moreover, when each organic EL element was lighted after the elapse of 780 hours, the light emitting area ratio (%) of Example 4 had about 10% reduction over the comparative example. The above results have demonstrated that Example 4 can be a high-performance product. In Example 4 in which the water-trapping agent 7 was employed, the organic layer 4 was not affected at all. This is because the organic solvent was substituted with the replacement material.

Example 5

Method for Manufacturing Organic EL Element with Silicone Oil

Example 5 was substantially equal to Example 2 except that modified silicone oil obtained from Shin-Etsu Chemical Co., Ltd. under the trade name of X-22-162C was used as the replacement material. In the light emitting area of the organic El element 11, the growth of dark spot was observed by microscope after a period of 200 hours under high temperature and humidity storage test condition (temperature: 85° C.; humidity: 85%). For comparison, organic EL element having hollow sealing structure in which the conventional water-trapping agent as described in Example 2 (organic solvent content: 13 wt %) was employed as comparative example.

As shown in FIG. 7, when each organic EL element was lighted after the elapse of 300 hours, the light emitting area ratio (%) of Example 5 was almost equal to that of the comparative example in which the conventional water-trapping agent was dried for 10 minutes at the temperature of 150° C. Moreover, when each organic EL element was lighted after the elapse of 780 hours, the light emitting area ratio (%) of Example 5 had about 20% reduction over the comparative example. The above results have demonstrated that Example 5 can be a high-performance product. In the Example 5 in which the water-trapping agent 7 was employed, the organic layer 4 was not affected at all. This is because the organic solvent was substituted with the replacement material.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A water-trapping composition disposed inside a hermetically sealed container and suitable for directly filling an organic EL device, the water-trapping composition comprising:

an organometallic compound of Formula 1 as a drying component:

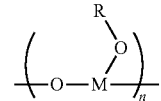

Formula 1 wherein R is selected from the group consisting of an alkyl group, an alkoxy group, an alkenyl group, an aryl group, a cyclohexyl group, a heterocyclic group and an acyl group; M is a trivalent metal atom; and n is an integer of 1 or above;

an organic solvent for dissolving the organometallic compound therein; and a viscous replacement material that replaces a part of the organic solvent, wherein the viscous replacement material is a long-chain hydrocarbon polymer having an average molecular weight of 700 to 3,700 and a viscosity of 600 Pa·S or below when heated to 60° C. present in a concentration of from 5 to 75% of the total weight of the water-trapping composition, wherein the long-chain hydrocarbon polymer is represented by Formula 24 below:

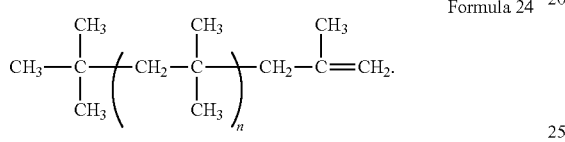

Formula 24

2. An organoelectronic device comprising an insulating element substrate on which a laminate of a pair of electrodes and an organic layer sandwiched between the pair of electrodes is disposed; a sealing cap opposed to the element substrate, and disposed apart from the element substrate; and the water-trapping composition of claim 1, wherein the water-trapping composition is disposed inside a container which is hermetically sealed by the element substrate and the sealing cap.

3. An organic solvent-free water-trapping composition disposed inside a hermetically sealed container and suitable for directly filling an organic EL device, the water-trapping composition comprising:

an organometallic compound of Formula 1 as a drying component:

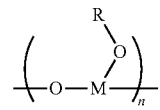

Formula 1 wherein R is selected from the group consisting of an alkyl group, an alkoxy group, an alkenyl group, an aryl group, a cyclohexyl group, a heterocyclic group and an acyl group; M is a trivalent metal atom; and n is an integer of 1 or above;

and a viscous replacement material that replaces all of an organic solvent that has been used for dissolving the organometallic compound therein, wherein the viscous replacement material is a long-chain hydrocarbon polymer having an average molecular weight of 700 to 3,700 and a viscosity of 600 Pa·S or below when heated to 60° C. present in a concentration of from 5 to 75% of the total weight of the water-trapping composition, wherein the long-chain hydrocarbon polymer is represented by Formula 24 below:

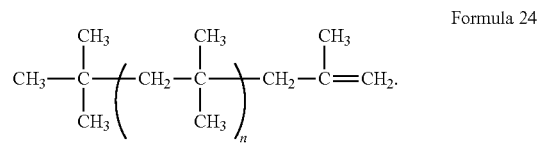

Formula 24

4. An organoelectronic device comprising a container hermetically sealed by a sealing cap and an insulating element substrate on which a laminate of a pair of electrodes and an organic layer sandwiched between the pair of electrodes is disposed, wherein an inner space of the container is filled with the water-trapping composition of claim 3.

* * * * *